United States Patent
Micheloni et al.

(10) Patent No.: US 6,574,146 B2
(45) Date of Patent: Jun. 3, 2003

(54) CIRCUIT AND METHOD FOR TIMING MULTI-LEVEL NON-VOLATILE MEMORIES

(75) Inventors: Rino Micheloni, Turate (IT); Luca Crippa, Busnago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 174 days.

(21) Appl. No.: 09/738,889

(22) Filed: Dec. 15, 2000

(65) Prior Publication Data

US 2001/0022753 A1 Sep. 20, 2001

(30) Foreign Application Priority Data

Dec. 17, 1999 (IT) .......................... MI99A2624

(51) Int. Cl.$^7$ .............................. G11C 16/04
(52) U.S. Cl. .............. 365/185.2; 365/185.21; 365/210
(58) Field of Search .............. 365/185.2, 185.21, 365/203, 210, 230.06, 189.07; 327/143, 198, 72, 77, 78

(56) References Cited

U.S. PATENT DOCUMENTS 6,278,638 B1 * 8/2001 Tomita et al. .............. 365/149

* cited by examiner

*Primary Examiner*—Vu A. Le
(74) *Attorney, Agent, or Firm*—Lisa K. Jorgenson; Dennis M. de Guzman; Seed IP Law Group PLLC

(57) ABSTRACT

A read timing circuit regulates the step of reading from a multi-level non-volatile memory, which circuit is of a type adapted to generate and issue an equalization signal to a sense amplifier placed downstream of a dummy path including at least one dummy wordline, the latter being applied a supply voltage and associated with a dummy decoding circuit portion which receives an ATD signal. The circuit comprises a differential cell comparator having a first input connected downstream of the dummy path and a second input to receive a reference signal, thereby generating an electric signal on an output upon the dummy wordline attaining a potential which is a predetermined percent of the supply voltage.

20 Claims, 9 Drawing Sheets

ATD GENERATION

CIRCUIT AND METHOD FOR TIMING MULTI-LEVEL NON-VOLATILE MEMORIES

TECHNICAL FIELD

This invention relates to a circuit and a method for timing multi-level non-volatile memories.

In particular, the invention relates to a read timing circuit for regulating the step of reading from a multi-level non-volatile memory, which circuit is adapted to generate and issue an equalization signal to a sense amplifier placed downstream of a dummy path, which dummy path includes at least one dummy wordline being applied a supply voltage and associated with a dummy decoding circuit portion arranged to receive an ATD signal.

BACKGROUND OF THE INVENTION

As is well known, in a two-level non-volatile memory which employs a floating-gate NMOS transistor as an elementary cell, a capability to modulate the threshold voltage of the memory cell is utilized for discriminating between two logic states. A first logic state (logic "1") corresponds to a situation of no charge being contained in the floating gate, as would be typical of a virgin or an erased cell. The other logic state (logic "0") corresponds to the floating gate having a sufficient number of electrons stored therein to produce a substantial rise of its threshold, signifying a programmed state of the cell.

To read from the memory cell, the gate is applied a read voltage Vread, and the current flowing through the cell is sensed: if the cell is written, its threshold voltage is higher than Vread and, therefore, no current will be passed. On the other hand, if the cell has been erased, its threshold voltage must be adequate to let current flow through it. The threshold voltage spread of the cells, following an electric erasement, is in the range of about 1V to 2.5V. Ensuring that there are no depleted cells and avoiding damage to the thin oxide of the transistor which comprises the cell, during the reading operation, are the governing factors for the lower limit, the upper limit being instead dictated by the intrinsic extent of the spread. The programmed spread would generally lie above 5V.

But in the instance of multi-level non-volatile memories, this spread is entirely different. In these memory types, the charge stored on the floating gate is further split into a number of spreads equal to $2^n$, where "n" is the number of bits to be stored in the same cell. Thus, with two bits per cell, there would be four spreads.

Comparative threshold voltage spreads, for a two-level memory and a multi-level memory having two bits per cell, are illustrated schematically by the plots in FIGS. 1A and 1B. As can be seen, the multi-level structure involves a reduction in the gap between voltage values, and an increased read voltage.

Also known is that memory cells are organized as rows and columns of a matrix, and that the physical organization of the memory matrix is decided by two fundamental considerations:

space occupation to be the least possible, for obvious reasons of cost; and memory access time, that is the time taken by the device to present the contents of the addressed location on its outputs, to fill ever stricter user's specifications. (Some 100 ns, nowadays.)

With access time being fundamental in determining the quality of a memory, this parameter is foremost in the designer's choices, above all of the matrix row size.

Schematized in FIG. 2 is the structure of a non-volatile memory of the NOR type. The gate terminals of the cells are interconnected at the rows or wordlines of the matrix, and the drain terminals are connected together to provide the columns or bitlines of the matrix.

Row and column binary decoders are respectively associated with the rows and the columns of the matrix, and enable each cell to be located univocally by addresses provided from outside the memory. The source terminals of the cells are connected to a common "source line," which is the same as a voltage reference, e.g., a ground reference, in the instance of EPROMs.

In Flash EEPROMs which allow for the memory matrix to be erased electrically, the source line is instead driven by purposely arranged circuitry.

The drain terminals are usually connected to form the bitlines by a metallization line. The gate terminals of one row are interconnected by a strip of a conductive material such as polysilicon (polycrystalline silicon). This strip of polysilicon, additionally to interconnecting the gates, is used to form the control gates of the memory cells.

FIG. 3 is an enlarged scale, schematic vertical cross-section view of a portion of a memory matrix, specifically a cell pair in a row. The cross-section in which the cell pair appear is taken at half-length of the polysilicon strip.

FIG. 3A shows schematically the electric equivalent of FIG. 3.

The polysilicon layer (Poly 2) which comprises and connects the control gates is doped quite different from the underlying layer of polysilicon (Poly 1) which provides the floating gate. By regarding the capacitive couplings between these conductive layers of Poly1 and Poly2 to be representative of capacitors with parallel planar plates separated by a dielectric layer of interpoly (FIG. 3B), the parasitic capacitance that associates with each cell can be readily calculated at values lying typically somewhere between 0.2 and 0.4 fF per cell.

Resistivity per square of the layer Poly2 is usually some ten Ohms. With the cell size and technological parameters being known factors, the time delay associated with the voltage rise across the wordline can now be calculated.

As an introductory approximation, a concentrated parameter model can be taken into consideration, with the time constant τ associated with the row given as:

$$\tau_{row} = R_{cell} * C_{cell} * N_{cell} \tag{1}$$

Assuming the row rise time to amount to no more than 10% of the overall access time, the maximum number of cells that can be connected to the same row can be calculated. The row time constant would usually be some ten nanoseconds.

The wordline voltage is therefore described by the following law:

$$V_{row} = V_{read} * (1 - e^{-t/\tau_{row}}) \tag{2}$$

The problems connected with the operation of reading the contents of the memory cells will now be reviewed.

Shown in FIG. 4 is a diagram of a conventional sense amplifier. The current flowed through a matrix cell and that through a reference cell are routed to a current/voltage I/V converter having outputs MAT and REF which represent the inputs to a final comparator operative to present the data in digital form.

The diode connection of P-channel transistors M12 and M13 in the I/V converter may be provided in either the matrix leg or the reference leg, as required. Gates NOR1 and NOR2 function, in combination with transistors M14 and M15, to prevent "soft-writing" or spurious cell writing during a reading operation. These elements form a feed-back cascode type of arrangement which restrains the drain terminal of the cell from exceeding a potential of 1V. Transistors M6, M7 and M8 are used for column decoding in the matrix. The basic layout just described is added auxiliary circuitry for improved dynamic performance, i.e., reading speed, of the sense amplifier.

A primary task of the auxiliary circuitry is to equalize, i.e., short-circuit, the critical nodes of the converter, biasing them to an optimum value from the standpoint of switch-over speed.

FIG. 5 shows an example of equalizing circuitry. This circuitry is only active as a signal SAEQ is at a logic high, and does not alter the sense amplifier operation when the signal is in the other of its states. Transistor M1 is operative to short-circuit the nodes MAT and REF directly. To obtain a perfectly even starting situation, the cascodes and drain nodes of the column decoders are usually equalized. Transistors M1 and M2 are low-threshold native transistors, while transistor M3 is a thick-oxide transistor because the bitline node is applied a relatively high (4 to 5V) programming voltage Vp.

The equalizing step allows the nodes to be reset at each reading, bringing them to a convenient voltage value. Transistors M4 and M5 are to provide increased current during the equalizing step for charging the bitline parasitic capacitances. Finally, the P-channel transistors which separate M4 and M5 from the supply serve a protective function against electrostatic discharges.

In essence, the equalizing step allows the voltage variation at the nodes MAT and REF to be minimized, as well as ensuring the same bias at each reading. In fact, the nodes are reset always to the same potential, irrespective of what may have occurred during the previous reading.

FIG. 6 shows a comparative graph vs. the same time base of the signals which appear in the sense amplifier during the equalizing step.

Generating and controlling the equalization signal SAEQ frequently poses hard problems to solve.

A first requirement is that the signal SAEQ should be related to the start of each new reading directly. Every memory of the asynchronous type includes circuitry operative to sense any changes occurring at address terminals outside the memory matrix which are connected to the decoders. This circuitry is to generate a suitable ATD (Address Transition Detection) pulsive signal. FIG. 7 illustrates schematically a correlation of the address transition occurring at the memory input terminal and the generation of the ATD pulse. Each new ATD pulse indicates a need for a new equalization pulse SAEQ.

The following considerations dictate the duration of the pulse SAEQ:

1) for maximum effectiveness of the equalizing step, this step should end while the addressed cell is still pulling its respective current; in other words, the comparator should commit to the correct side immediately;
2) the duration of the equalizing step should not be drawn out beyond necessity, so as not to incur a time penalty which would nullify all advantage; and
3) the converter nodes should be given time to attain start-up voltage.

It can be appreciated from the above considerations that the lower limit for the signal SAEQ is set by the time required to correctly bias the cell, both as regards gate voltage and drain voltage. In fact, the floating gate transistor would be a MOS transistor in all cases, and its drain current would be dependent on both gate voltage and drain voltage, given that the source terminal is at ground potential.

As said before, the wordline charge lies close to an RC charge having a 10 ns value. Biasing the drain terminal usually takes less time than the wordline, because it is achieved through a metallization connection and, therefore, uninfluenced by the RC effects typical of polysilicon conductors.

The problems posed by generating the equalizing pulse have been addressed in the state of the art, and a number of solutions offered.

Only the closing phase of the pulse SAEQ will be considered herein below, as the start-up phase is dependent on the ATD signal.

The simplest solution is that of providing a delay chain to set the duration of the signal SAEQ based on the ATD signal. Once the wordline time constant is calculated, the performance of the sense amplifier can be assessed by computer simulation, and an optimum value for the signal SAEQ be found. However, this solution has a serious drawback in that it cannot follow variations in the technological process of fabricating the electronic storage device (the so-called "process spread") automatically.

The delay brought about by the wordline charging is related directly to the resistivity of the strip of Poly2. Since forming a polysilicon layer with resistivity of a few Ohms is one of the most critical processing steps, the spread of this parameter can be substantial.

The solution provided by the use of a delay chain is, therefore, rather inflexible, in the sense that hardware provisions, such as one or more masks for application during the process of fabricating the memory circuit, become necessary to vary it.

A more flexible solution than this consists of using a "dummy" row as shown schematically in FIG. 8. A dummy row is identical with (i.e., has the same time constant as) a matrix row, but locates outside the addressing space. Each time that a new ATD pulse occurs, the decoding portion and dummy wordlines are activated concurrently. The dummy row is connected to a comparator which will determine the moment that the dummy row attains a given percent of the supply voltage Vdd. In general, the signal SAEQ can be constructed here using a set/reset type of flip-flop. The ATD pulsive signal will act on the set terminal, while the comparator output will cause the signal SAEQ to be reset.

Should the wordline time constant be increased by variations in the technological parameters, the above circuit is capable of retarding the signal SAEQ as appropriate.

While being in many ways advantageous, this solution is unsuitable for application to multi-level storage devices.

Assume the power supply to be at 5V. As shown in FIG. 1, the supply voltage Vdd is adequate for reading two-level cells, but not multi-level cells which would require at least 6V in view of the current allowances demanded by the sense amplifier for discriminating between currents at either voltage levels.

Thus, multi-level cells need timing circuitry which would indicate the moment the row attains a read voltage Vread of at least 6V, although receiving a lower supply voltage. In this context, moreover, the wordline voltage should be determined with great accuracy, due to multi-level reading being allowed typically narrow margins.

A current market trend for non-volatile memories favors memories having a single power supply, to meet the requirements of portable applications, such as cellular telephones, palm-tops, etc. With a single power supply, all voltages above the supply voltage Vdd must be generated internally by means of voltage boosters.

A major problem with the use of voltage boosters is their limited current capacity, hardly higher than one mA. Where stable voltages are demanded, it is further necessary to provide a suitable regulator, interposed between the voltage booster and the utility, and the regulator effectiveness clearly is also tied to the dynamic current draw that occurs during row decode switch-overs. In other words, the utilization of the read voltage Vread should be restrained as far as possible in order to retain its stability. In the light of such considerations, it can be appreciated that the simplest solution available for two-level memories, i.e., that of supplying the same read voltage to both the dummy comparator and its reference, is useless with multi-level structures.

SUMMARY OF THE INVENTION

An embodiment of this invention provides a timing circuit for a multi-level non-volatile memory with appropriate structural and functional features to allow the duration of the equalization signal needed for a memory reading operation to be regulated in a fully independent manner of the fabricating process spread, thereby to overcome the limitations of prior art solutions.

A principle on which this invention stands proceeds from the observation that the wordline transient is independent of the absolute value of the voltage that it should attain, and is only dependent on the time constant associated therewith. In other words, the wait time for a given percent of the read voltage to be attained is not tied to this voltage value.

An embodiment of the invention is directed to a read timing circuit for regulating reading from a multi-level non-volatile memory by generating and issuing an equalization signal to a sense amplifier placed downstream of a dummy path. The dummy path includes a dummy wordline to which is applied a supply voltage and is associated with a dummy decoding circuit portion arranged to receive an ATD signal. The read timing circuit includes a differential cell comparator having a first input connected downstream of the dummy path, a second input arranged to receive a reference signal, and an output at which an electric signal is generated upon said dummy wordline attaining a potential that is a predetermined percentage of said supply voltage.

The features and advantages of a circuit and a method according to the invention will become apparent from the following description of embodiments thereof, given by way of non-limitative examples with reference to the accompanying drawings.

DETAILED DESCRIPTION OF THE INVENTION

Figure 1A:
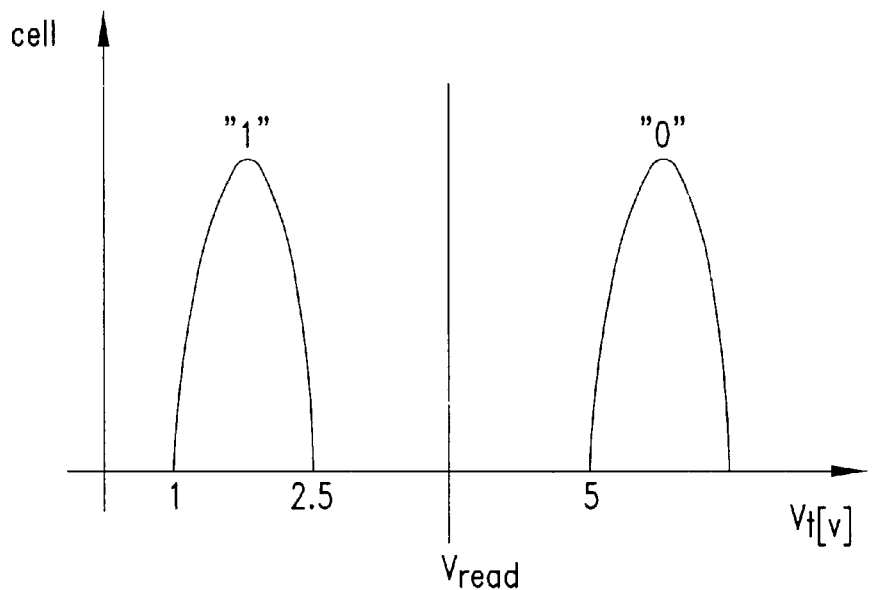
FIGS. 1A and 1B provide, in schematic form as respective plots vs. the same time base, a comparison of threshold voltage spreads for a two-level memory and a multi-level memory with two bits per cell.
Figure 1B:
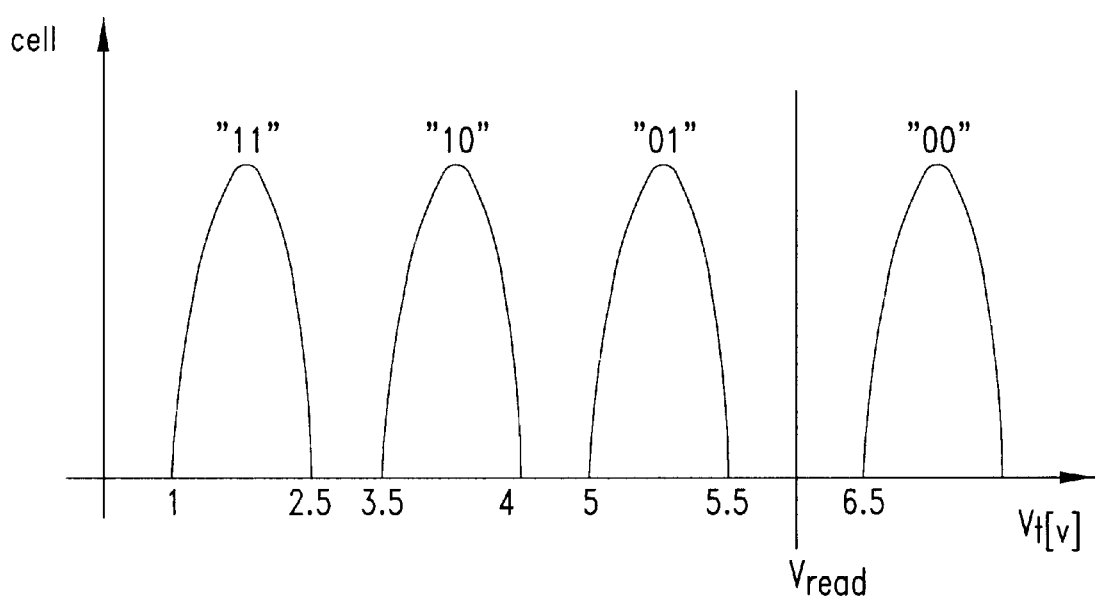
Figure 2:
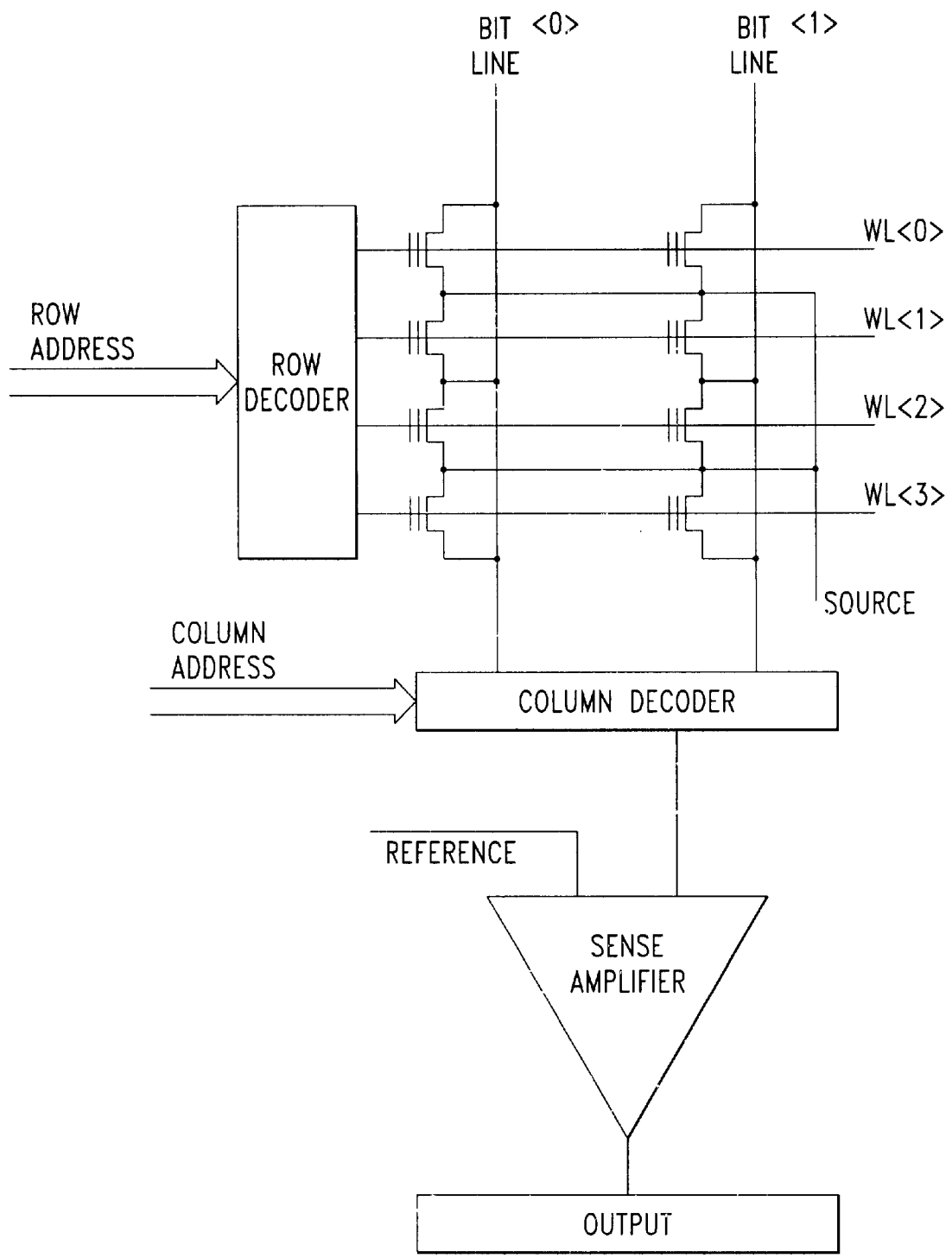
FIG. 2 shows schematically the structure of a NOR type of non-volatile memory.
Figure 3A:
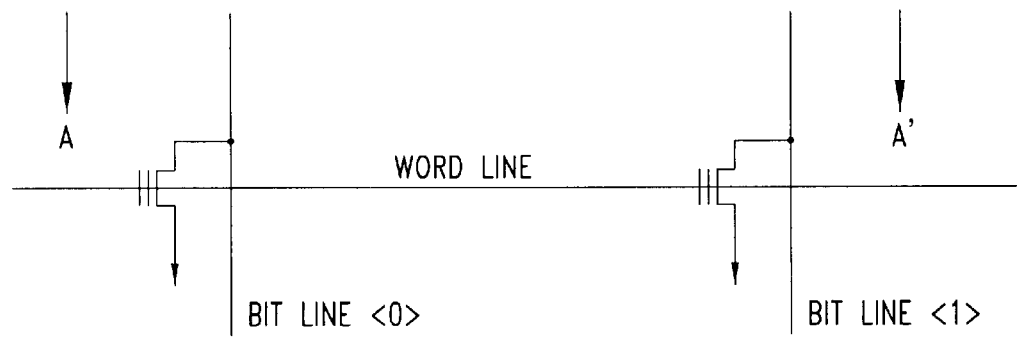
FIG. 3A shows schematically an electric equivalent of FIG. 3.
Figure 3:
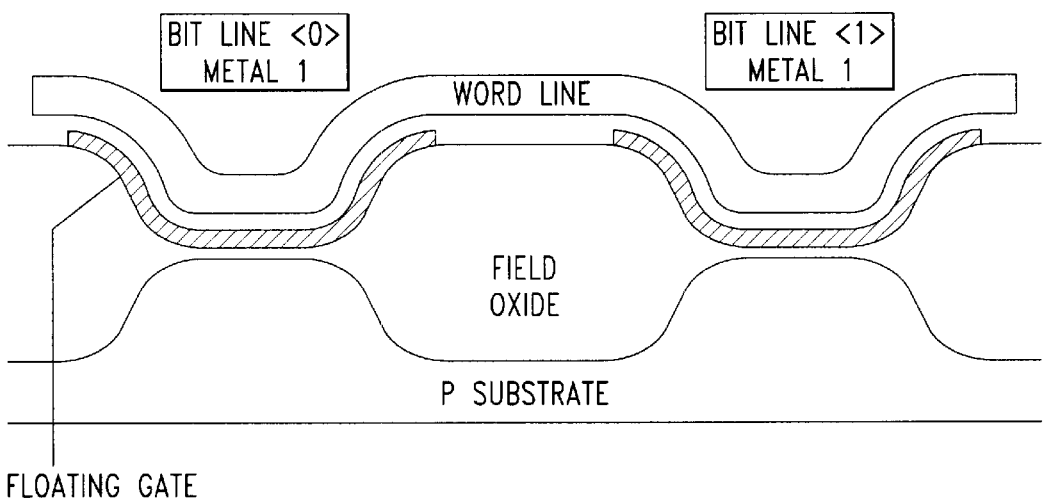
FIG. 3 shows schematically, in a vertical cross-section view to an enlarged scale, a memory matrix portion, namely a cell pair of one row.
Figure 3B:
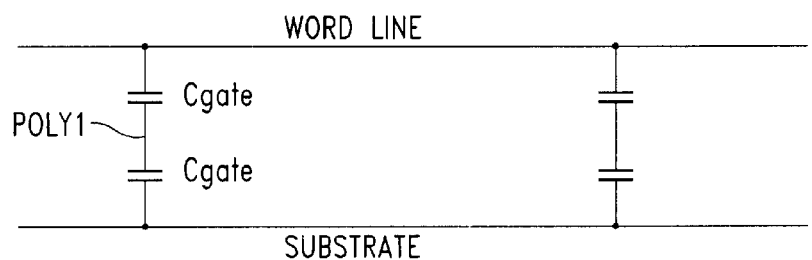
FIG. 3B shows schematically the capacitive coupling of a wordline to the semiconductor substrate in a multi-level memory.
Figure 4:
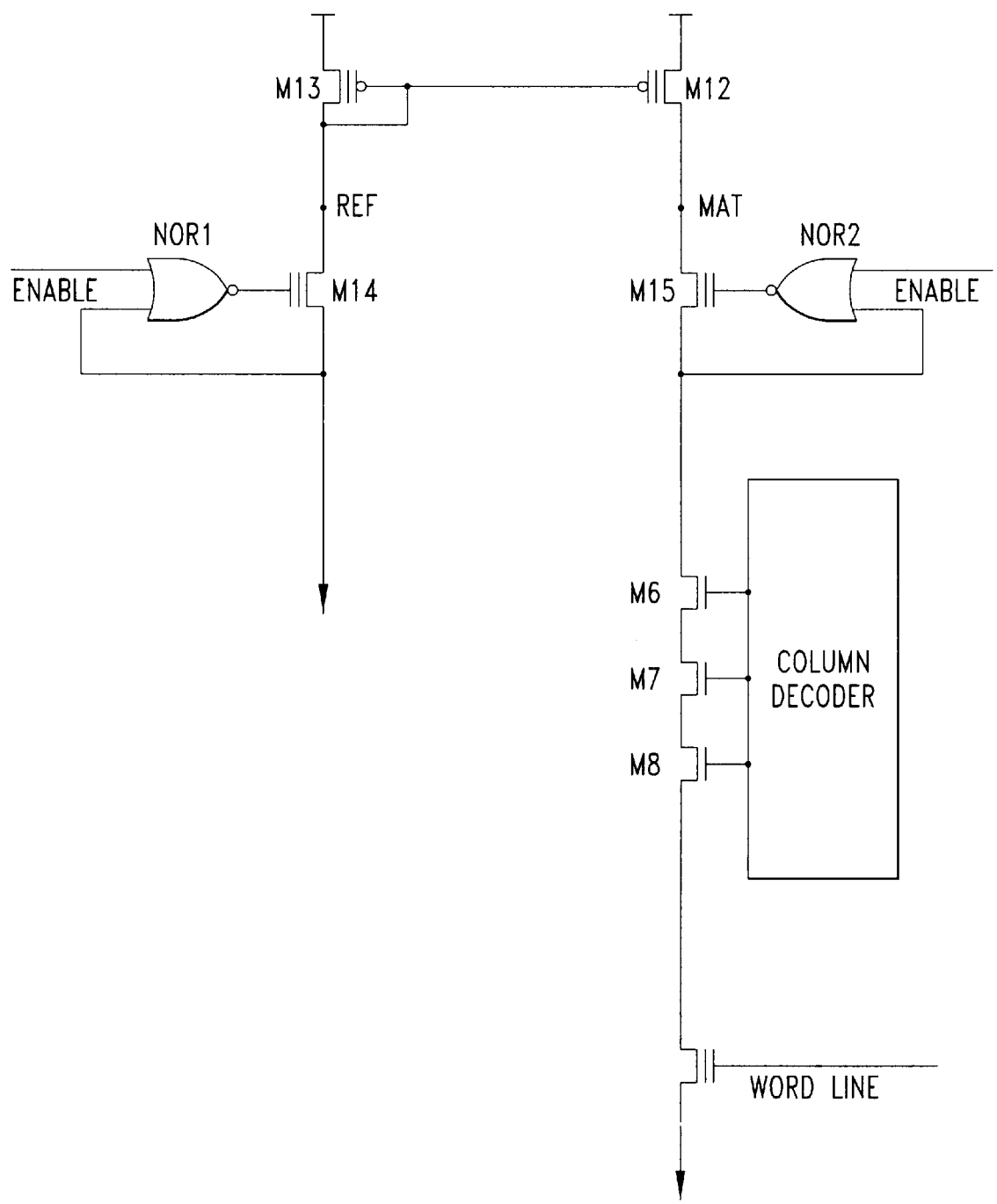
FIG. 4 is a schematic diagram of a sense amplifier according to the prior art.
Figure 5:
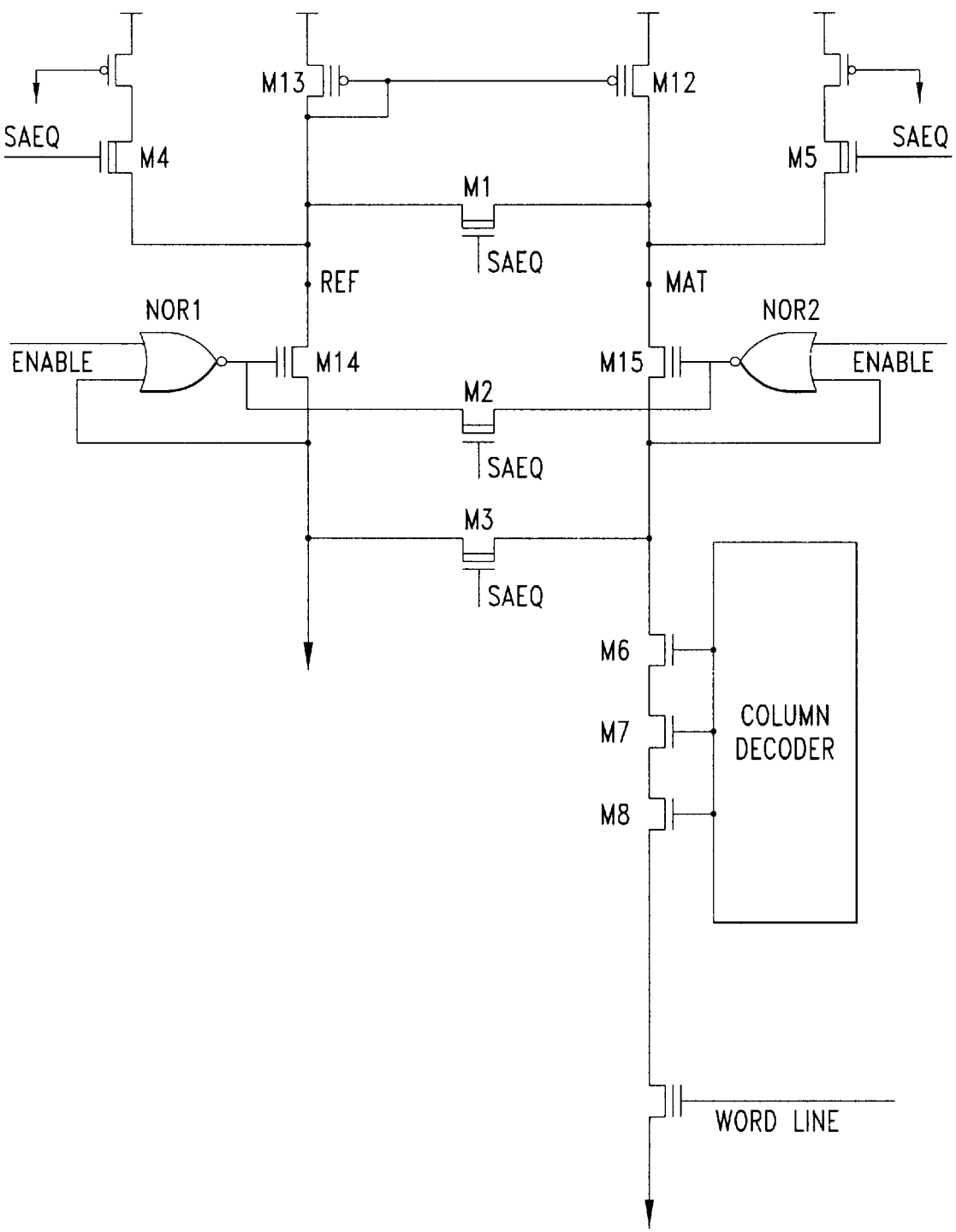
FIG. 5 is a schematic diagram of the amplifier of FIG. 4, as provided with an equalizing network.
Figure 6:
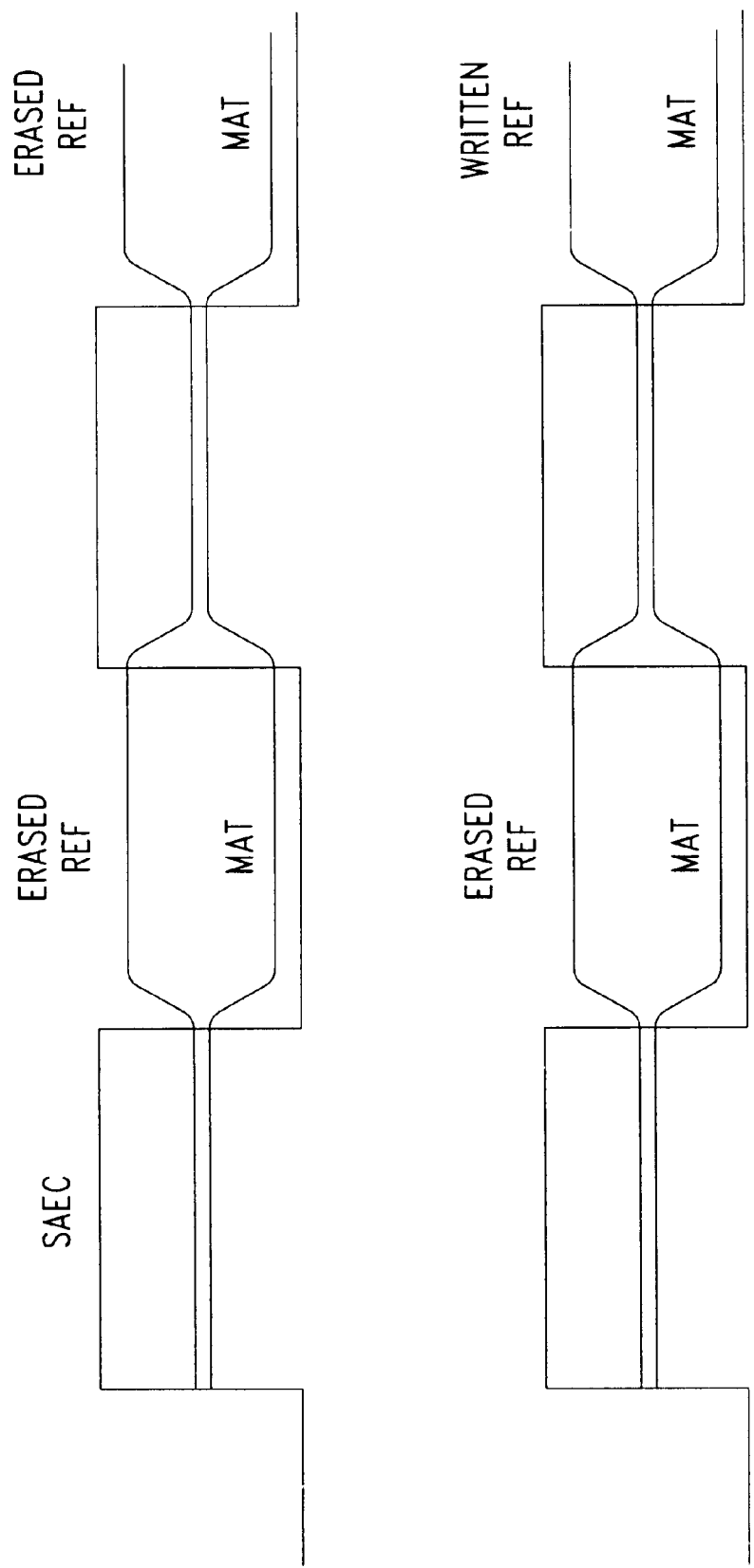
FIG. 6 is a plot vs. time of signals present in the equalizing network of FIG. 5.
Figure 7:
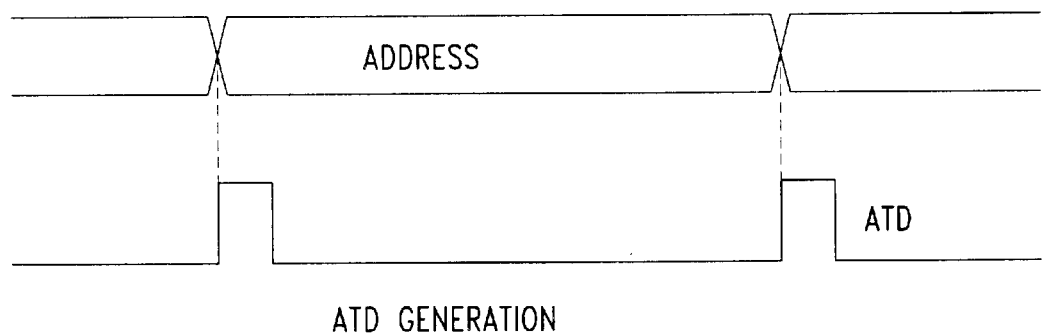
FIG. 7 is a graph showing schematically the pattern of an ATD signal present in non-volatile storage devices.
Figure 8:
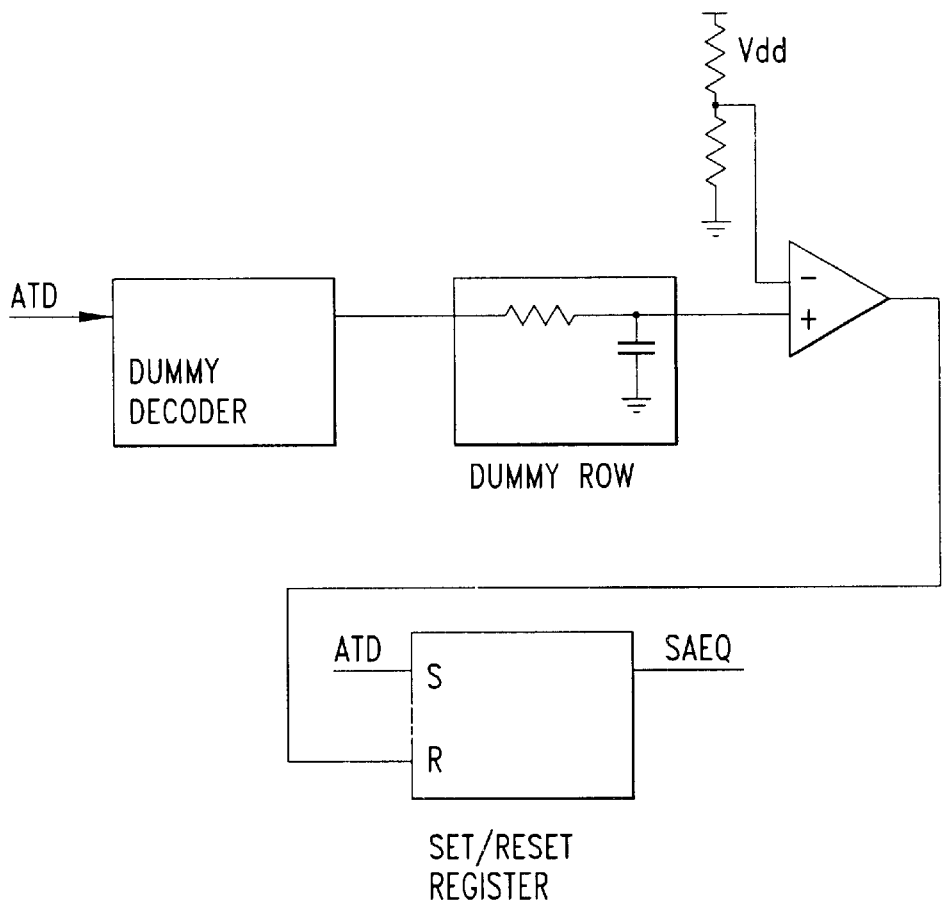
FIG. 8 is a schematic diagram of a conventional circuit as employed with a two-level memory having a dummy path.
Figure 9:
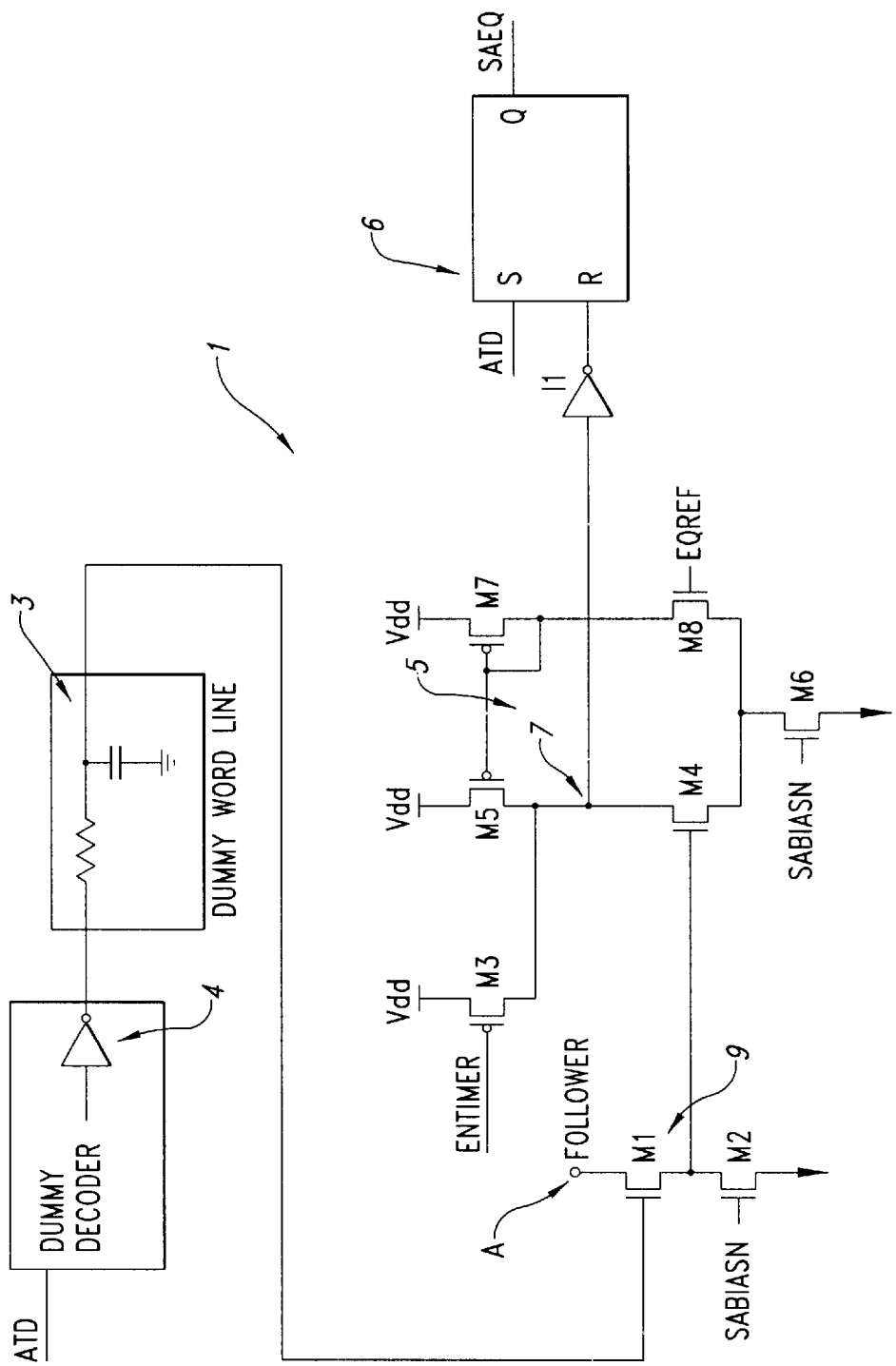
FIG. 9 is a schematic diagram of a read timing circuit according to the invention.

Referring in particular to FIG. 9 of the drawings, a read timing circuit for regulating the read phase of a multi-level non-volatile memory, according to this invention, is generally shown at 1 in schematic form.

The memory is omitted from view because conventional, but would comprise a matrix of multi-level memory cells integrated in an electronic semiconductor memory device also including pertinent address, decode, read, write and erase circuitry.

The memory whereto the circuit 1 is incorporated may be an electrically erasable Flash EEPROM.

As said before, conventional decoding circuitry is associated with the matrix of non-volatile memory cells which becomes active upon receiving a switching edge of an ATD pulsive signal.

Paralleling the memory matrix is a dummy path which consists of dummy wordlines, shown at 3 in FIG. 9, having respective dummy decoding circuitry 4 associated therewith. For simplicity in this description, the dummy wordline has been modeled and represented in the drawings in the form of an RC circuit.

The dummy row is quite identical with any matrix row and has the same time constant, but locates outside the addressing space. Each time that a new ATD pulse occurs, the dummy decoding portion 4 and wordline 3 are also activated in parallel with the matrix path. Each dummy row is connected to a comparator 5 which determines the moment that a dummy row attains a given percent of the supply voltage Vdd.

The output 7 of the comparator 5 is connected to a signal generator 6 issuing a signal SAEQ. The generator 6 may comprise a simple set/reset flip-flop, for example. The ATD pulsive signal acts on the set terminal, the signal SAEQ being reset by the output from the comparator 5.

An inverter I1 is provided downstream of the comparator 5 to digitalize its output 7.

Advantageously, the comparator 5 of the circuit 1 has a particular construction described herein below according to one embodiment.

The comparator 5 is realized with MOS technology as a differential stage, and comprises a first input transistor pair M4, M8 which have their source terminals connected together. The transistors M4, M8 are NMOS transistors.

Provided between the interconnect node of these two transistors and the ground reference is an enable transistor M6 receiving a signal SABIASN on its control terminal.

The control terminal of a first transistor, M4, in the pair M4, M8 is connected to an interconnect circuit node of a voltage divider 9. The voltage divider 9 comprises a series of two transistors M1, M2 which are connected between a node A, also designated FOLLOWER, and ground. A first M1 of these transistors has its control terminal connected to the dummy line. The node A is held at a predetermined potential by a circuit 8, to be described below with respect to FIG. 10.

The second transistor M2 of the voltage divider 9 receives the signal SABIASN on its control terminal.

The control terminal of the second transistor M8 of the first transistor pair M4, M8 receives a signal EQREF issuing from the circuit 8 to be described.

A second transistor pair M5, M7 is connected between the first pair M4, M8 of the comparator 5 and the supply voltage reference Vdd to allow of the comparator biasing. The second pair comprise PMOS transistors.

Placed in parallel with the first transistor M5 of the second transistor pair is a PMOS transistor M3 which receives a signal ENTIMER on its control terminal. The other transistor M7 of the second transistor pair has a diode configuration.

The signal ENTIMER controls the timing circuit 1 to operate when in a high logic state. The signal SABIASN is an analog signal utilized to bias the transistor M6 which forms a current generator for the comparator 5. Alternatively, the signal SABIASN could be provided by a bandgap reference generator.

The transistor M3 is used for biasing the output 7 of the comparator 5 to the logic high while the circuit is 'off,' to avoid wasting power. While the circuit 1 is in operation, the node denoted by FOLLOWER is at the supply potential Vdd and biases the transistor M1 which receives the signal from the dummy wordline 3 on its gate terminal. M1 is operated in a source-follower configuration, and accordingly, will transfer the signal presented on its gate terminal to its source terminal, as shifted through a voltage equal to its threshold voltage. The transistor M2 is used for biasing the transistor M1 and enabling it to operate in the source-follower mode.

Figure 10:
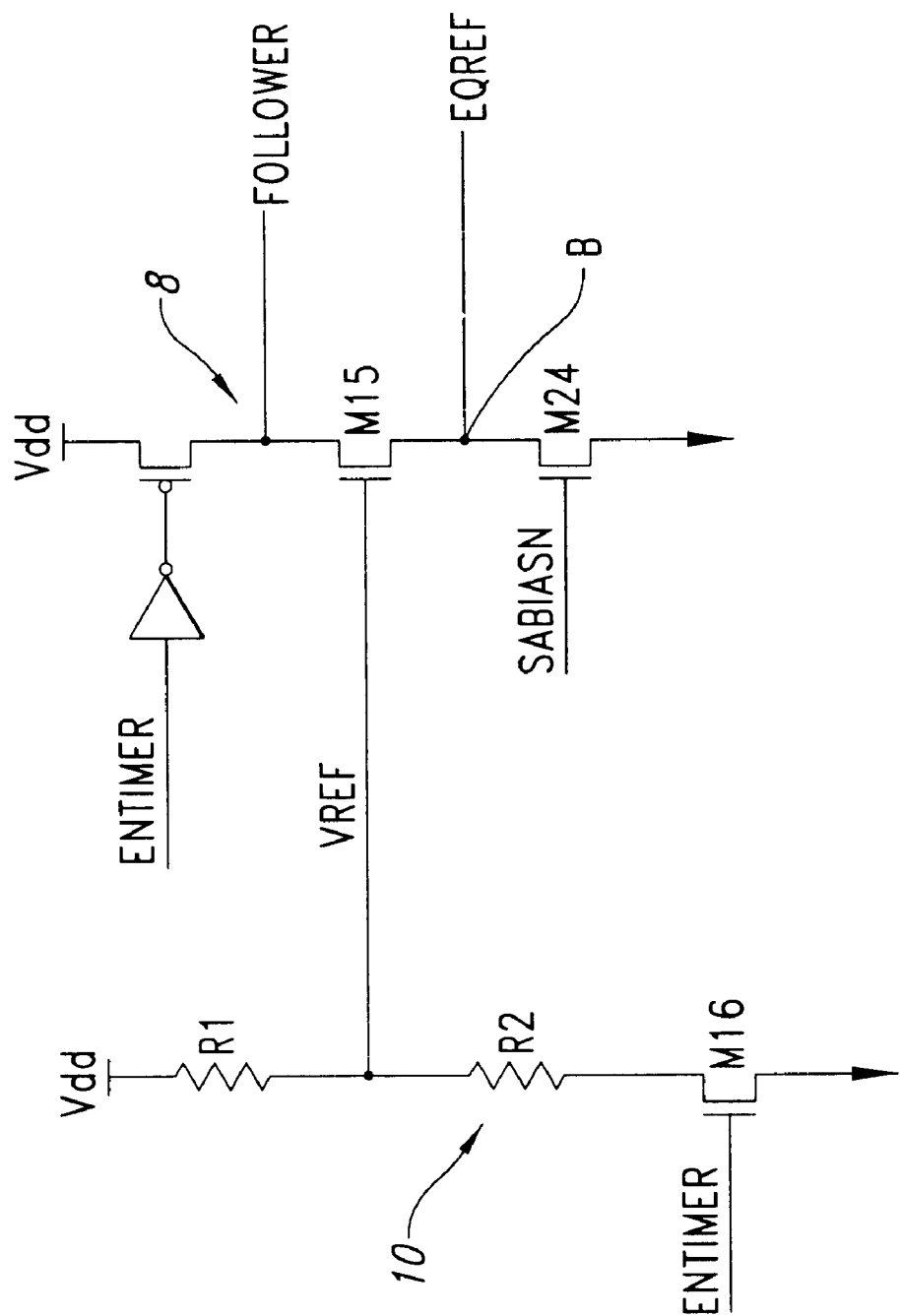
FIG. 10 is a schematic diagram of a circuit portion associated with the timing circuit of this invention.

Shown schematically in FIG. 10 is the structure of the circuit 8 which produces the signal EQREF.

The signal EQREF is generated at an interconnect node B of a series of transistors M15 and M24. The transistor M15 is operated in the source-follower mode to transfer a reference signal VREF, applied to its gate terminal, to the node B, as shifted by one threshold. The signal VREF is provided by a fraction of the supply voltage Vdd obtained through a resistive divider 10 which is connected in series with an enable transistor M16, the latter being controlled by the signal ENTIMER.

The value of VREF can be regulated as desired. With the comparator 5 being a differential stage, in order to know the moment that the dummy wordline 3 attains steady state, the circuitry should be made as symmetrical as possible, so as to attenuate offset effects. Thus, in a preferred embodiment, the transistors M2 and M24 are chosen identical with each other, i.e., of the same size, and so are the transistors M1 and M15.

For example, if the time when two time constants have elapsed is to be determined, the dummy circuit can be supplied the voltage Vdd, and the reference potential EQREF of the comparator 5 can be set at 86% of the supply voltage Vdd, as indicated by relation (2) above.

However, since the expected accuracy for multi-level reading requires that the time when the matrix wordline attains the read voltage Vread of 6V be known exactly, the comparator 5, being supplied Vdd, would indicate the time when the dummy wordline 3 attains the potential of Vdd.

The voltage shift of the signals input to the comparator 5 allows the latter to operate correctly and sense the attainment of the supply potential Vdd by the dummy wordline 3. This will also mean that the matrix row has attained the read voltage Vread.

Of course, the inventive principle can also be applied to signals other than the equalization signal of sense amplifiers. In fact, the circuit 1 is useful to indicate the moment when any signal lines are biased to their steady-state values. With this circuit design, the steady-state condition can be determined through the use of circuitry which is supplied the device own supply voltage, that is, with no necessity for any other voltages, whether internally or externally generated. Thus, there is no need of a delay chain, and the variations of the technological process can be followed automatically.

To summarize, with the circuit and the method of this invention, the reading of a multi-level memory can be timed correctly. Simulation tests carried out by the Applicant have given supporting results, both as regard the effectiveness of this solution and the correctness of the approximation applied to concentrated wordline parameters at the modeling stage. The polysilicon row represents, in fact, a typical example of a spread parameter network, and the concentrated parameter approximation used in describing this invention might have led to errors in the time estimates.

On the other hand, simulations performed with equivalent circuits of the wordline (such as that shown at 10, taken from Marco Annaratone, "Digital CMOS Circuit Design," Kluwer Academic Publishers) have demonstrated the ratio of output voltage to input voltage not to be dependent on the absolute value of steady-state voltage, but rather on the values of R and C only. Thus, the circuit 1 retains its grounds even when the scale model of the wordline is considered.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A read timing circuit for regulating reading from a multi-level non-volatile memory by generating and issuing an equalization signal to a sense amplifier placed downstream of a dummy path including at least one dummy wordline, with said dummy wordline being applied a supply voltage and associated with a dummy decoding circuit portion arranged to receive an ATD signal, the read timing circuit comprising:

a first MOS transistor having a control terminal coupled to the dummy wordline, a first terminal coupled to a first voltage reference, and a second terminal; and a differential cell comparator having a first input coupled to the second terminal of the first MOS transistor; a second input arranged to receive a reference signal, and an output at which an electric signal is generated upon said dummy wordline attaining a potential that is a predetermined percentage of said supply voltage.

2. A circuit according to claim 1, wherein the first MOS transistor is connected in a source-follower configuration.

3. A circuit according to claim 2, wherein said first MOS transistor is connected, in series with another transistor, between the first voltage reference and a second voltage reference.

4. A circuit according to claim 3, further comprising a generator circuit having a first output coupled to the first MOS transistor and a second output coupled to the second input of the comparator, the generator circuit being structured to generate said first voltage reference at the first output and deliver from the second output said reference signal to the second input of the comparator.

5. A circuit according to claim 2, further comprising a generator circuit having an output at which said reference signal to the second input of the comparator is produced, said generator circuit comprising a stable voltage generator connected upstream of a second MOS transistor connected in a source-follower configuration.

6. A circuit according to claim 5, wherein said first and second MOS transistors connected in a source-follower configuration are the same size.

7. A circuit according to claim 1, further comprising an inverter and a signal generator, the inverter connecting the output of the comparator to the signal generator.

8. A circuit according to claim 7, wherein said signal generator is a set/reset flip-flop having a set input that receives the ATD signal and a reset input connected to the output of the comparator.

9. A circuit according to claim 1, further comprising a second MOS transistor having a control terminal that receives an enable signal and an output terminal connected to the output of the comparator to bias the output of the comparator when the comparator is inactive.

10. A method of sensing a steady-state bias value of a signal line being supplied a supply voltage, the method comprising:
    comparing a reference voltage produced by a circuit means, being supplied the same supply voltage as said signal line, and a voltage present at said signal line; and
    issuing an equalization signal in response to said signal line achieving a voltage value that is a predetermined percentage of the supply voltage.

11. An electronic multi-level non-volatile memory device integrated in a semiconductor, comprises:
    a cell matrix and associated address, decode, read, write and erase circuitry;
    a dummy path which includes at least one dummy wordline, said dummy wordline being supplied a supply voltage and associated with dummy decode circuitry arranged to receive an ATD signal; and
    an auxiliary read timing circuit connected to the dummy path and structured to generate and issue an equalization signal to a sense amplifier placed downstream of the dummy path, wherein the read timing circuit includes;
        a first MOS transistor having a control terminal coupled to the supply voltage, a first conduction terminal coupled to the supply voltage, and a second conduction terminal at which a reference signal is produced; and
        means of comparing a potential of the dummy path with a reference signal, so as to generate said equalization signal upon said dummy wordline attaining a potential that is a predetermined percentage of said supply voltage.

12. A circuit according to claim 11, further comprising a second MOS transistor connected in a source-follower configuration and having a control terminal coupled to the dummy wordline, a first conduction terminal coupled to a first voltage reference, and a second conduction terminal coupled to an input of the comparing means.

13. A circuit according to claim 12 wherein said second MOS transistor is connected, in series with another transistor, between the first voltage reference and a second voltage reference.

14. A circuit according to claim 13, wherein the first conduction terminals of the first and second MOS transistors are connected to each other.

15. A circuit according to claim 12 wherein the second MOS transistor connected in a source-follower configuration.

16. A circuit according to claim 15, wherein said first and second MOS transistors are the same size.

17. A circuit according to claim 11, further comprising an inverter and a signal generator, the inverter connecting an output of the comparing means to the signal generator.

18. A circuit according to claim 17 wherein said signal generator is a set/reset flip-flop having a set input that receives an ATD signal and a reset input connected to the output of the comparing means.

19. A circuit according to claim 11, further comprising a second MOS transistor having a control terminal that receives an enable signal and an output terminal connected to an output of the comparing means to bias the output of the comparing means when the comparing means are inactive.

20. A circuit according to claim 11, further comprising a voltage divider connected between the supply voltage and a reference voltage and having an intermediate node connected to the control terminal of the first MOS transistor.

* * * * *